United States Patent [19]

Park

[11] Patent Number: 5,773,310

[45] Date of Patent: Jun. 30, 1998

[54] METHOD FOR FABRICATING A MOS TRANSISTOR

[75] Inventor: Sung Wook Park, Kyoungki-do, Rep. of Korea

[73] Assignee: Hyundai Electronics Industries Co., Ltd., Ichon-kun, Rep. of Korea

[21] Appl. No.: 504,172

[22] Filed: Jul. 19, 1995

[30] Foreign Application Priority Data

Jul. 20, 1994 [KR] Rep. of Korea .................... 94-17550

[51] Int. Cl.⁶ .................... H01L 21/335; H01L 21/8242
[52] U.S. Cl. .................... 437/40; 437/47; 437/186
[58] Field of Search .................... 437/40 SW, 41 SW, 437/40 R, 41 R, 186, 47

[56] References Cited

U.S. PATENT DOCUMENTS

| | | | |
|---|---|---|---|
| 4,722,909 | 2/1988 | Parrillo et al. | 437/44 |
| 4,948,744 | 8/1990 | Kita | 437/44 |
| 4,994,404 | 2/1991 | Sheng et al. | 437/415 W |
| 5,141,891 | 8/1992 | Arima et al. | 437/40 SW |
| 5,240,872 | 8/1993 | Motonami et al. | 437/52 |
| 5,416,034 | 5/1995 | Bryant | 437/47 |

OTHER PUBLICATIONS

Wolf et al., Silicon Processing for the VLSI Era, vol. 1, Proceeds Technology, Calif., Lattice Press, 1986, p. 527.

*Primary Examiner*—Chandra Chaudhari
*Assistant Examiner*—Toniae M. Thomas
*Attorney, Agent, or Firm*—Reid & Priest L.L.P.

[57] ABSTRACT

A transistor fabricated by a characteristic method which comprises forming a source/drain region prior to the formation of a gate electrode and then, forming source/drain pads which are in contact with the source/drain and insulated from the gate electrode, comprising a MOSFET structure in which two identical conductors are a predetermined distance away from each other on a semiconductor substrate beneath each of which a source/drain diffusion region is formed in electrical connection with it and between which a gate oxide film is formed on the semiconductor substrate, and a gate electrode extends over the two separated connectors while being insulated therefrom. It secures enough mask alignment allowance and is widely applied not only to transistors but also to DRAMs or SRAMs.

7 Claims, 2 Drawing Sheets

5,773,310

METHOD FOR FABRICATING A MOS TRANSISTOR

BACKGROUND OF THE INVENTION

1. Field of the Invention

The present invention relates, in general, to a transistor and a method for fabricating the transistor and, more particularly, to an improvement in mask alignment allowance along with the method.

2. Description of the Prior Art

When fabricating a MOSFET, a gate electrode is formed, followed by a source/drain and then, a contact hole in this region. However, these processes may cause a problem that a short circuit is formed between the contact and the gate electrode. Solutions to this problem include precise mask alignment and enough distance between the contact and the gate electrode. The former solution, however, requires a very expensive apparatus, giving rise to an increase in production cost, and the latter may be a significant barrier to the high integration of semiconductor devices.

SUMMARY OF THE INVENTION

Accordingly, it is an object of the present invention to overcome the above-mentioned problems and to provide a method for fabricating a transistor, which is capable of securing sufficient mask alignment allowance upon photosensitive film processes.

It is another object of the present invention to provide a transistor having a structure which can be easily fabricated and widely applied.

In accordance with one aspect of the present invention, there is provided a method for fabricating a transistor, comprising the steps of: depositing a blanket first insulating film on a semiconductor substrate; selectively etching the first insulating film to form contact holes through which a portion of the semiconductor substrate for source/drain is exposed; implanting dopants into the exposed area of the semiconductor substrate to form source/drain diffusion regions, said dopants being of different type from the semiconductor substrate; filling the contact holes with a conductive material, to form conductors; subjecting the first insulating film to dry etch to form first insulating film spacers at the side walls of the conductors; forming a gate oxide film and a conductor oxide film on the semiconductor substrate thus exposed and the conductors, respectively; depositing a conductive layer for a gate electrode and a second insulating film, in sequence, on the resulting structure; selectively etching the conductive layer and the second insulating film by use of a gate electrode mask, to form a gate electrode and a second insulating film pattern; forming a third insulating film spacer at the side wall of the gate electrode; etching the conductor oxide film on the top of the conductors, to expose the conductors; and forming source/drain pads which are connected with the conductors and insulated from the gate electrode.

In accordance with another aspect of the present invention, there is provided a transistor comprising a MOSFET structure in which two identical conductors are a predetermined distance away from each other on a semiconductor substrate beneath each of which a source/drain diffusion region is formed in electrical connection with it and between which a gate oxide film is formed on the semiconductor substrate, and a gate electrode extends over the two separated connectors while being insulated therefrom.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1A:
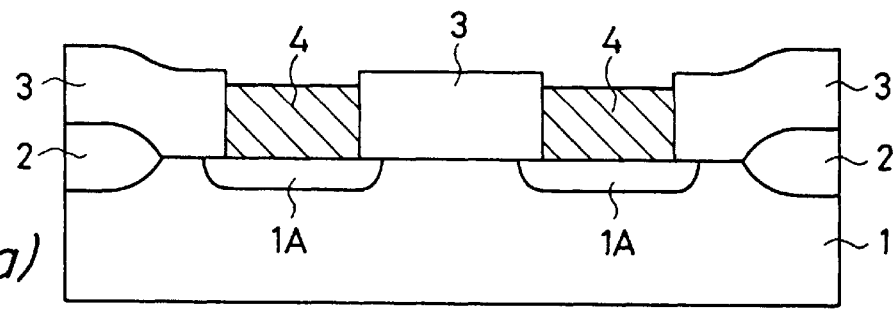
FIGS. 1(a) through 1(d) are schematic cross sectional views showing a method for fabricating a transistor, according to the present invention.

The application of the preferred embodiments of the present invention is best understood with reference to the accompanying drawings, wherein like reference numerals are used for like and corresponding parts, respectively.

FIGS. 1(a) through 1(d) show the preferred self-aligning process steps of fabricating a transistor, according to the present invention. These steps will be described in detail in connection with FIGS. 1(a) through 1(d).

First, as shown in FIG. 1(a), element isolation insulating films 2 are formed on a semiconductor substrate 1 and a first insulating film 3 is deposited over the entire surface of the resulting structure and selectively etched to form contact holes through which a portion of the semiconductor substrate for source/drain is exposed. In this figure, it is also shown that dopants which differ in type from the semiconductor substrate are implanted into the contact regions 1A by an ion implanter, to form source/drain diffusion regions, followed by the selective growth of conductors 4 in the contact holes. Alternatively, the conductors 4 may be formed by depositing a blanket conductive material and etching it without mask.

Figure 1B:
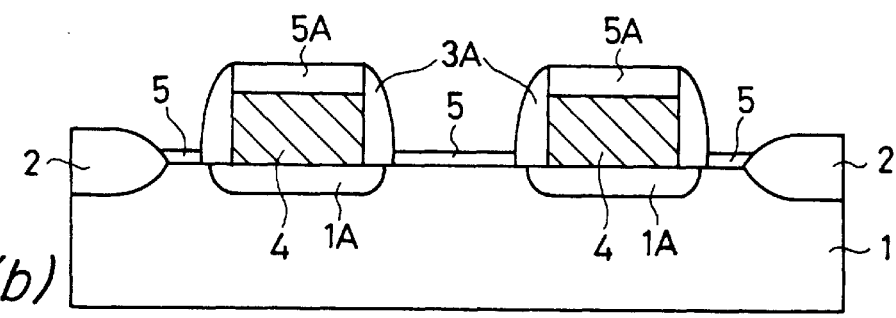

Second, with reference to FIGS. 1(a) through 1(b), the first insulating film 3 is subjected to anisotropic dry etch, to form an insulating film spacer 3A at the sidewall of each conductor 4, followed by the formation of gate oxide films 5 on the substrate exposed. At that moment, conductive oxide films 5A are formed on the top of each conductor 4.

Figure 1C:
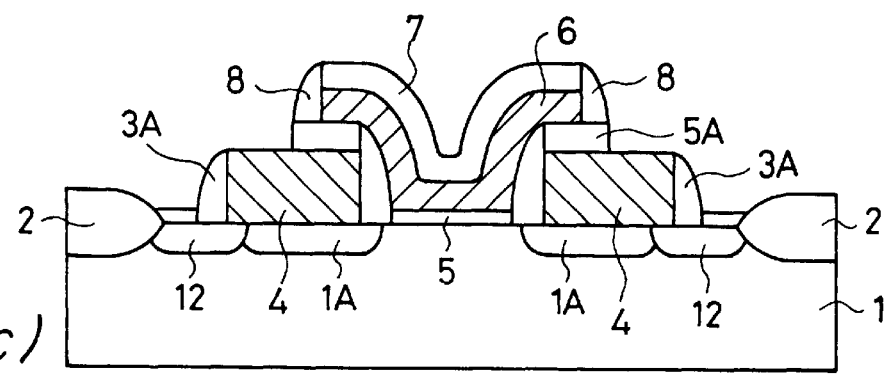

Next, with reference to FIG. 1(c), a conductive layer for gate electrode and a second insulating film are in sequence deposited and subjected to selective etch by use of a gate electrode mask, to form a gate electrode 6 and a second insulating film pattern 7, respectively. Thereafter, a third insulating film is deposited and subjected to anisotropic etch, to form a third insulating film spacer 8 at the sidewall of the gate electrode 6. Exposed areas of the conductive oxide films 5A are etched and dopants which are different from the semiconductor substrate 1 in type are diffused into the substrate 1, to form diffusion regions 12. The third insulating film spacer 8 may be formed subsequent to etching the exposed area of the conductive oxide film after the gate electrode 6 is formed.

Figure 1D:
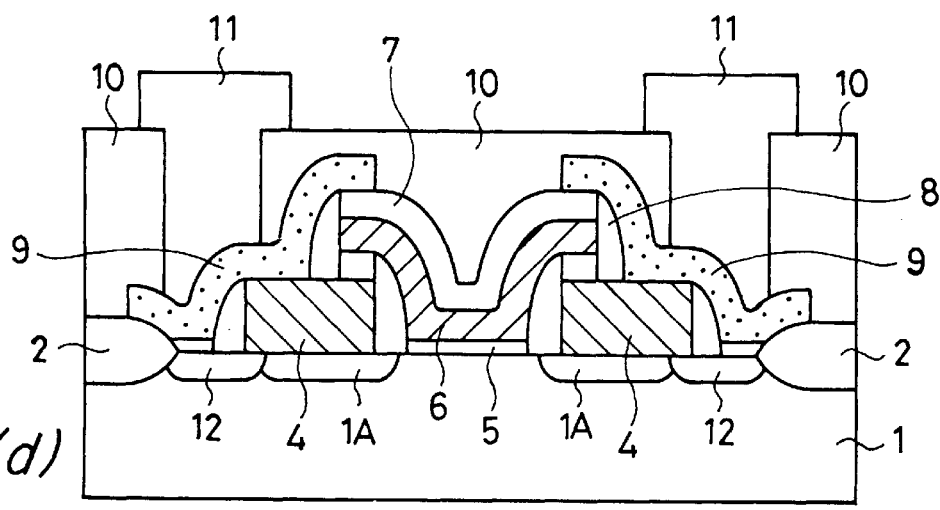

Finally, with reference to FIG. 1(d), a conductive layer is deposited over the entire surface of the resulting structure of FIG. 1(c) and etched under a source/drain pad mask, to form source/drain pads 9 which are in contact with the conductor 4 and overlap with the gate electrode 6. A blanket of fourth insulating film 10 for planarization is formed and then, etched under a source/drain contact mask, to form contact holes through which parts of the source/drain pad 9 are exposed, followed by the formation of conductive layers 11 which are in contact with the source/drain pad 9.

In accordance with the above-described method, since the source/drain pad 9 is formed in such a way to overlap with both the element isolation insulating film 2 and the gate electrode 6, alignment allowance for the contact mask can be secured sufficiently when the fourth insulating film 10 for planarization is etched by use of the source/drain contact mask, to form the contact hole through which parts of the source/drain pad 9 are exposed.

Figure 2:
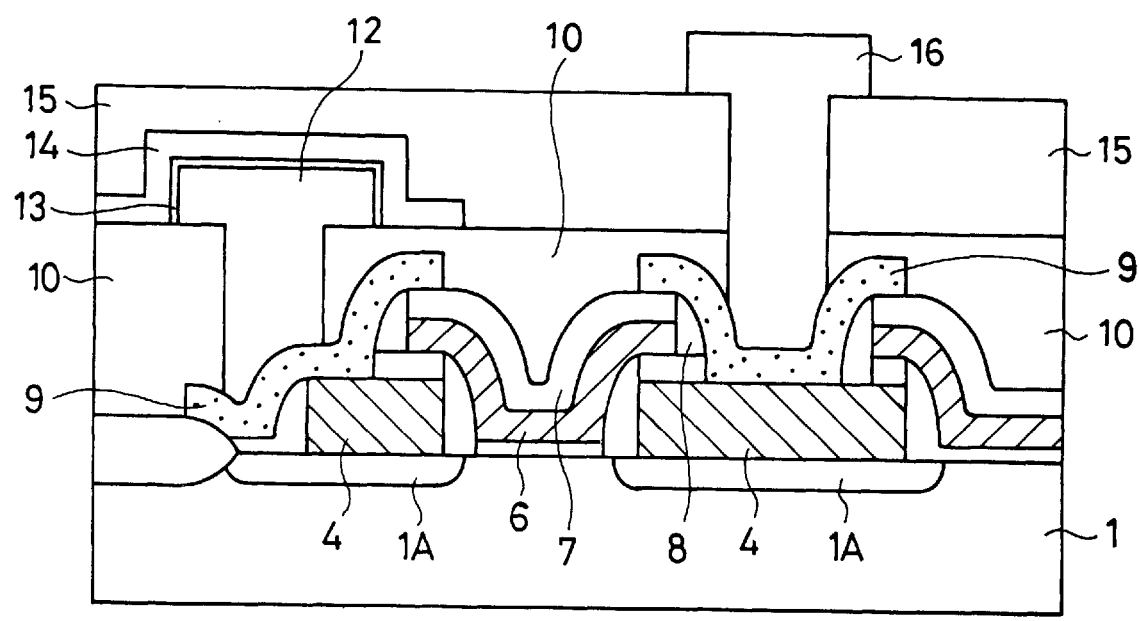
FIG. 2 is a cross sectional view showing a DRAM to which the transistor of the present invention is applied.

FIG. 2 shows that the transistor of the present invention is applied for DRAM. First, two transistors which are fabricated in the same processes as in FIGS. 1(a) through 1(d) are arranged symmetrically. Thereafter, the left source/drain pad 9 is exposed through a contact hole which is, then, filled with a storage electrode 12 for a capacitor. On the storage electrode 12 in contact with the source/drain pad 9 are sequentially formed a dielectric film 13 and a plate electrode 14. A blanket fifth insulating film 15 is formed and the right source/drain pad 9 is exposed through a contact hole by, for example, selectively etching the fifth insulating film 15. Thereafter, a bit line 16 comes into contact with the right source/drain pad 9 by filling the contact hole.

As described hereinbefore, the method according to the present invention cannot only secure sufficient mask alignment allowance for photosensitive film processes upon fabrication of highly integrated semiconductor devices, but also can be applied to a wide range of cells including DRAM and SRAM.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for fabricating a transistor, comprising the steps of:
   (a) depositing a first insulating film on a semiconductor substrate of a first conductivity type;
   (b) selectively etching the first insulating film to form a contact hole in the first insulating film, wherein a portion of the semiconductor substrate is exposed through the contact hole, forming an exposed area of the semiconductor substrate for source/drain;
   (c) implanting dopants into the exposed area of the semiconductor substrate to form source/drain diffusion regions, the dopants having a second conductivity type that is different from the first conductivity type of the semiconductor substrate;
   (d) filling the contact hole with a conductive material, to form a conductor therein;
   (e) subjecting the first insulating film to dry etch to form first insulating film spacers at the sidewalls of the conductor;
   (f) forming a gate oxide film and a conductor oxide film on the semiconductor substrate and the conductor, respectively;
   (g) depositing a conductive layer for a gate electrode and a second insulating film, in sequence, on the structure formed in step (f);
   (h) selectively etching the conductive layer and the second insulating film by use of a gate electrode mask, to form a gate electrode and a second insulating film pattern;
   (i) forming a third insulating film spacer at the sidewall of the gate electrode;
   (j) etching the conductor oxide film on the top of the conductor to expose the conductor; and
   (k) forming a source/drain pad that is connected to the conductor and insulated from the gate electrode.

2. A method in accordance with claim 1, wherein the gate oxide film and the conductor oxide film are formed by thermal oxidation.

3. A method in accordance with claim 1, further comprising the step of diffusing dopants into the semiconductor substrate to form a diffusion region in the semiconductor substrate adjacent to the source/drain diffusion region, subsequent to forming the third insulating film spacer in step (i), wherein the dopants have a conductivity type different from the first conductivity type of the semiconductor substrate.

4. A method in accordance with claim 1, wherein the conductor is formed by a selective growth process or by a process which comprises forming a conductive layer on the structure formed in step (c) and then etching the conductive layer until the first insulating film is exposed.

5. A method in accordance with claim 1, wherein step (i), formation of the third insulating film spacer, is performed after step (j), and the third insulating film spacer is formed by depositing a third insulating film over the structure formed in step (j), and subjecting the third insulating film to dry etch to form the third insulating film spacer.

6. A method in accordance with claim 1, wherein source/drain pad is formed so that it overlaps a portion of the gate electrode.

7. A method in accordance with claim 1, wherein:
   first and second contact holes are formed in step (b);
   first and second conductors are formed in the first and second contact holes, respectively, in step (d);
   first and second source/drain pads are formed in step (k);
   the first and second conductors are connected to the first and second source/drain pads, respectively;
   the first conductor serves as a bit line; and
   the second conductor serves as a storage electrode of a capacitor.

* * * * *